United States Patent [19]
Masaki

[11] Patent Number: 5,574,995
[45] Date of Patent: Nov. 12, 1996

[54] RADIO RECEIVER WITH A HIGH SPEED AND ACCURATE SEARCH OPERATION AND METHOD THEREOF

[75] Inventor: Tateo Masaki, Sakura, Japan

[73] Assignee: Uniden Corporation, Chiba, Japan

[21] Appl. No.: 356,022

[22] Filed: Dec. 14, 1994

[30] Foreign Application Priority Data

Sep. 28, 1994 [JP] Japan .................................... 6-233847

[51] Int. Cl.⁶ ...................................................... H04B 1/16
[52] U.S. Cl. ................................ 455/161.2; 455/165.1; 455/168.1; 455/183.2
[58] Field of Search ............................ 455/161.2, 165.1, 455/168.1, 169.1, 183.1, 184.1, 188.1, 208, 161.1, 161.3, 167.1, 196.1, 197.1, 183.2

[56] References Cited

U.S. PATENT DOCUMENTS 4,451,850  5/1984  Kamemoto .......................... 455/165.1
4,763,195  8/1988  Tults .................................... 455/166.1
5,199,109  3/1993  Baker .

FOREIGN PATENT DOCUMENTS 0149117    7/1985   European Pat. Off. .
59-169137  11/1984  Japan .

Primary Examiner—Chi H. Pham
Attorney, Agent, or Firm—Lowe, Price, LeBlanc & Becker

[57] ABSTRACT

A controller shifts the frequency of the local oscillator with a frequency shift circuit so that as many channels to be scanned as possible will be included within specified bandwidths, detects a desired received signal by scanning each of the specified bandwidths with the shifted frequency, scans each channel within the bandwidth where the desired received signal was detected, and changes the frequency of the local oscillator or shifts the frequency of the local oscillator with the frequency shift circuit so that the desired channel frequency identified above will be at the center of said bandwidth.

14 Claims, 11 Drawing Sheets

Freq : FREQUENCY
Vd : OUTPUT VOLTAGE FROM FREQUENCY DISCRIMINATOR
V1 : LOWER SIDE THRESHOLD VOLTAGE
V2 : UPPER SIDE THRESHOLD VOLTAGE Freq : FREQUENCY
Vd : OUTPUT VOLTAGE FROM FREQUENCY DISCRIMINATOR
V1 : LOWER SIDE THRESHOLD VOLTAGE
V2 : UPPER SIDE THRESHOLD VOLTAGE

RADIO RECEIVER WITH A HIGH SPEED AND ACCURATE SEARCH OPERATION AND METHOD THEREOF

FIELD OF THE INVENTION

The present invention relates to a method of selecting a station for a radio receiver and a radio receiver using the same. The convention relates more particularly to a method of selecting a station for a radio receiver enabling a high speed and accurate search operation for a plurality of bands with less hardware and without the necessity to provide a plurality of intermediate frequency filter circuits, wave detection circuits or the like even when receiving a plurality of bands (such as, for instance, VHF or UHF) in a radio receiver, and a radio receiver using the same.

BACKGROUND OF THE INVENTION

In a conventional type of radio receiver based on a frequency synthesizer system such as, for instance, an FM receiver, when selecting a station electronically, the operation for selecting a station is carried out by searching channels one by one.

Herein, terms used in the following description are defined as follows. Assuming that programmed frequencies have been allocated to a plurality of channels, "scan" is defined as sequentially scanning a specified channel in the order of channels, while "search" is defined as continuously scanning a specified frequency range (with specified upper and lower limits) at a specified frequency space (channel step).

FIG. 5 is a block diagram of a first conventional type of FM radio receiver. In this figure, the first conventional type of radio receiver comprises an antenna 101, a radio receiver 102, a frequency discriminator 103, a squelch circuit 104, a low frequency amplifier 105, a speaker 106, a window detector 507, a frequency synthesizer 109, a CPU (central processing unit) 510, and a keyboard 111.

A description is made for a search operation in the normal state of an FM radio receiver having the configuration as described above with reference to the flow chart shown in FIG. 6. It should be noted that the figure shows a processing sequence of the CPU 510 controlling the normal search operation.

At first, in Step S601, the CPU 510 starts operation of a squelch signal detection timer to detect a squelch signal SC (indicating existence of a received signal) from the squelch circuit 104, and makes a determination as to whether the squelch signal has been detected in Step S602.

If the squelch signal SC is not detected in Step S602 and the squelch signal detection timer has not timed out in Step S603, control again returns to Step S602, and the operation for detecting the squelch signal SC is continued. If the squelch signal detection timer has timed out, PLL data PD for the next channel is transmitted to the frequency synthesizer 109 in Step S605.

If the squelch signal SC is detected in Step S602, determination as to whether a window signal WD from the window detector 507 has been detected is executed in Step S604. Herein the window signal WD is a signal indicating existence of a received signal in a specified bandwidth (window) based on an output voltage Vd from the frequency discriminator 103.

If the window signal WD is detected in Step S604, it is determined that a desired frequency was searched and the processing is terminated. If the window signal WD is not detected, PLL data PD for the next channel is sent to the frequency synthesizer 109 in Step S605.

For instance, as shown in FIG. 7, if it is assumed that the channel step is 12.5 KHz and a desired signal frequency is at a position of an arrow shown by a bold solid line in the figure, processing from Step S601 to S605 is repeatedly executed for search S701 to S705 with the processing from S601 to S604 executed in search S706, so that a desired signal frequency can be searched.

As described above, to execute normal search in this conventional type of FM radio receiver, it is necessary to execute scanning sequentially, channel by channel, which makes it impossible to execute search at a high speed.

FIG. 8 is a block diagram illustrating a second conventional type of FM radio receiver. In this conventional type of FM radio receiver, turbo search operation enabling search operation at a higher speed can be executed so that the problems in the first conventional type of radio receivers as described above are evaded.

The second conventional type of FM receiver, shown in FIG. 8, employs an A/D convertor 108 as the window detector 507 in the first conventional type of receiver described above and also employs a CPU 810 as the CPU 510.

Next, a description is made for the turbo search operation in the second conventional type of FM radio receiver as described above with the flow chart in FIG. 9. It should be noted that the figure shows a processing sequence by the CPU 810 controlling the turbo search operation.

In Step S901, the CPU 810 actuates a squelch signal detection timer to detect a squelch signal SC from the squelch circuit 104, and in Step S902 determination is made as to whether the squelch signal has been detected.

If the squelch signal SC is not detected in Step S902 and the squelch signal detection timer has not timed out in Step S903, control again returns to Step S902 to detect the squelch signal SC. If the squelch signal detection timer has timed out, the PLL data PD with data for three channels added thereto is sent to the frequency synthesizer 109 in Step S904.

If the squelch signal SC is detected in Step S902, determination as to whether output from the A/D convertor 108, namely output voltage Vd from the frequency discriminator 103 is in a range between an upper threshold voltage V2 and a lower threshold voltage V1, is executed in Step S905.

The upper threshold voltage V2 and the lower threshold voltage V1 are set as indicated by the characteristics of the frequency discriminator 103 shown in FIG. 4. Namely, assuming that output voltage from the frequency discriminator 103 corresponding to a received frequency F0 is V0, the upper threshold voltage V2 corresponds to a frequency between F0 and F0+ (1 channel step), while the lower threshold voltage V1 corresponds to a frequency between F0− (1 channel step) and F0.

In Step S905, if the output voltage Vd from the frequency discriminator 103 is not in a range between the upper threshold voltage V2 and the lower threshold voltage V1, determination is made as to whether the output voltage Vd is less than the lower threshold voltage V1 in Step S906. In Step S905, if the output voltage Vd from the frequency discriminator 103 is in a range between the upper threshold voltage V2 and lower threshold voltage V1, it is determined that a desired frequency has been searched, and the processing is terminated.

In Step 906, if the output voltage Vd is less than the lower threshold voltage V1, data for 1 channel step is subtracted from the current PLL data in Step S907, and the PLL data PD after subtraction is sent to the frequency synthesizer 109 in Step S909. Also in Step S906, if the output voltage Vd is not less than the lower threshold voltage V1, data for 1 channel step is added to the current PLL data in Step S908, and the PLL data after addition is sent to the frequency synthesizer 109 in Step S909.

For instance, as shown by the explanatory drawing for a turbo search operation in FIG. 10, if it is assumed that the channel step is 5 KHz and a desired signal frequency is at a position of the arrow expressed with a bold solid line in the figure, processes from Step S901 to S S904 above and that in S909 are executed repeatedly for search S1001 to S1002, operations in Steps S901, S902, S905, S906, S907, and S909 are executed for search S1003. Furthermore, operations in Step S901, S902, and S905 are executed in search S1004, and thus a desired signal frequency is searched. It should be noted that the trapezoidal section shown at the center of FIG. 10 indicates a bandwidth to be searched (a window including 3 channels), and a bandwidth when a desired signal frequency is specified is a trapezoidal range shown with a bold solid line in the figure.

As described above, in the second conventional type of radio receiver, a search is usually executed once for every 3 channels, and when a signal is detected, a search is executed for each channel, so that a search operation can be executed at a higher speed as compared to the first conventional type of radio receiver.

Then, a portion of the wave detection characteristics by the frequency discriminator 103 according to the first and second conventional type of radio receiver is shown in FIG. 11.

However, the conventional types of radio receiver as described above are generally constructed so that signal can be received in a plurality of bands (such as, for instance, VHF or UHF).

In the first conventional type of radio receiver, scanning is executed with a 5 KHz channel step for a VHF band, while scanning is executed with a 12.5 KHz channel step for a UHF band, but it is required to execute scanning sequentially, channel by channel, which makes it impossible to execute search at a high speed.

In the second conventional type of radio receiver, when a turbo search operation is executed for a VHF band, a search is executed once for every specified bandwidth (a window including 3 channels), and when a signal is detected, a search is executed channel by channel (1 channel step=5 KHz), so that a search operation can be executed at a 3 times higher speed than that in the first conventional type of radio receiver. As the channel step for the UHF band is 12.5 KHz, however, usually only 1 channel is included in the specified bandwidth (window), and even if a turbo search operation is executed according to the same sequence, it is impossible to obtain substantially the same effect.

In the VHF band where scanning is executed with a 5 KHz channel step, it never occurs that a channel is registered in an adjoining frequency, but in the UHF band where scanning is executed with a 12.5 KHz channel, the possibility for a channel to be registered in an adjoining frequency is high, and if such a state occurs, a plurality of signals exist in a bandwidth (window). Even if a turbo search operation is executed according to the same sequence, it is difficult to identify a frequency.

Furthermore, when a specified bandwidth (window) is extended to execute a turbo search operation for the UHF band according to the same sequence as that for a turbo search operation for the VHF band, it is necessary to provide frequency filter circuits in the radio receiving section 102 individually and also it is necessary to prepare detection circuits in the frequency discriminator 103 each corresponding to the bandwidth respectively individually. The impossibility of sharing these circuits disadvantageously results in an increase of hardware.

SUMMARY OF THE INVENTION

It is an object of the present invention to provide a method of selecting a station for a radio receiver and a radio receiver using the same in which, even when receiving signals in a plurality of bands (such as, for instance, VHF or UHF) for different channels, it is not necessary to provide a plurality of intermediate frequency filter circuits or detection circuits individually in a radio receiver and also it is possible to executed more accurate search operation at a higher speed for a plurality of bands having a different channel step respectively with less hardware.

A method of selecting a station for a radio receiver according to the present invention is a method of selecting a channel from those each having a prespecified frequency set thereto respectively and comprises a first frequency shift step in which a frequency of a local oscillator is shifted so that more channels to be scanned will be included in a specified bandwidth, a first scanning step in which scanning is executed for each of the bandwidths above with the shifted frequency, a second scanning step in which scanning is executed for each channel within the bandwidth when a signal is detected in the first scanning step, and a second frequency shift step in which a frequency of the local oscillator is shifted so that a desired channel frequency identified in the second scanning step will be at the center of the bandwidth.

For this reason, for instance, when a turbo search operation is executed to the VHF band, as in the second conventional type of radio receiver described above, a search is executed for each of specified bandwidths (window including 3 channels). When a signal is detected, a search is made for each channel (1 channel step=5 KHz), and furthermore 2 channels are included in the specified bandwidth by shifting a frequency of a local oscillator by 6.25 KHz to the UHF band. Hence, a turbo search operation operable at a 2 times higher speed as compared a speed in the first conventional type of radio receiver can be realized by executing a search for each of the specified bandwidths (window including 2 channels) according to the sequence similar to that in the second conventional type of radio receiver and also executing a search for each channel (1 channel step=12.5 KHz) when a signal is detected.

It accordingly is not necessary to provide a plurality of intermediate frequency filter circuits or detection circuits separately in a radio receiver, and also it is possible to realize a method of selecting a station for a radio receiver enabling a more accurate search operation at a higher speed for a plurality of bands (such as, for instance, VHF or UHF) each having a different channel step with less hardware.

A method of selecting a station for a radio receiver according to present invention, is a method of selecting a station for a radio receiver in which a channel is selected from those each having a prespecified frequency allocated thereto respectively and comprises a first frequency shift step in which a frequency of a local frequency is shifted so that 2 channels to be scanned will be included within a specified bandwidth, a first scanning step in which scanning is executed for each of the specified bandwidths with the shifted frequency, a second scanning step in which scanning is executed for each channel within the specified bandwidth when a signal is detected in the first scanning step and a frequency obtained by adding a scanning width in the first channel scanning step to the frequency currently oscillated by the local oscillator when the frequency of the detected signal is not less than the central frequency of the bandwidth, and a second frequency shift step in which the frequency of the local oscillator is shifted so that the desired channel frequency identified in the second scanning step will be at the center of the bandwidth.

For this reason, when executing a turbo search operation to the VHF band, as in the second conventional type of radio receiver, a specified bandwidth is searched as a window including 3 channels, and 2 channels are included within the specified bandwidth by shifting a frequency of a local oscillator by 6.25 KHz to the UHF band, so that, if search is usually executed for each of the bandwidths but for each channel after a signal is detected (1 channel step=12.5), a turbo search operation operable at a 2 times higher speed as compared to that in the first conventional type of radio receiver can be realized. Thus, it is possible to realize a method of selecting a station for a radio receiver enabling a more accurate search operation at a higher speed for a plurality of bands (such as, for instance, VHF or UHF) each having a different channel step respectively with less hardware.

In a method of selecting a station for a radio receiver according to the present invention, the frequency of the local oscillator is shifted in the direction reverse to that in the first frequency shift step by the same rate in the second frequency shift step. With this feature, it is possible to achieve the same effects as those in the methods of selecting a station for a radio receiver according to the above inventions.

In a method of selecting a station for a radio receiver according to the present invention, it is desirable that the local oscillator is a frequency synthesizer using a phase-locked loop (PLL).

Furthermore a radio receiver according to the present invention is a radio receiver which selects a channel from channels each having a prespecified frequency respectively thereto, shifts the frequency of a local oscillator with a frequency shift circuit so that as many channels to be scanned as possible will be included within a specified bandwidth of, for instance, an intermediate frequency filter, mixes for instance a received signal with the shifted frequency of the local oscillator to convert it to an intermediate frequency in the radio receiving section, converts a frequency of a signal having passed through the intermediate frequency filter in a squelch circuit to a voltage with a frequency discriminator, and makes a determination as to whether the received signal is a desired one depending on an output voltage from the frequency discriminator.

In the controller, scanning is executed for each specified bandwidth, and if a desired received signal is detected by the squelch circuit, further scanning is executed for each channel in the bandwidth in which the desired received signal was detected, and the frequency of a local oscillator is changed or the frequency of a local oscillator is shifted by the frequency shift circuit so that the specified preferable channel frequency will be at the center of the bandwidth.

For the reasons as described above, as in the methods of selecting a station for a radio receive according to the above inventions, it is not necessary to provide a plurality of intermediate frequency filter circuits or detection circuits separately in a radio receiver, and a radio receiver allowing a more accurate search operation at a higher speed for a plurality of bands (such as, for instance, VHF or UHF) each having a different channel step respectively can be realized with less hardware.

Other objects and features of this invention will become understood from the following description with reference to the accompanying drawings.

DESCRIPTION OF THE PREFERRED EMBODIMENTS

Detailed description is made for one embodiment of the present invention with reference to the related drawings.

Figure 1:
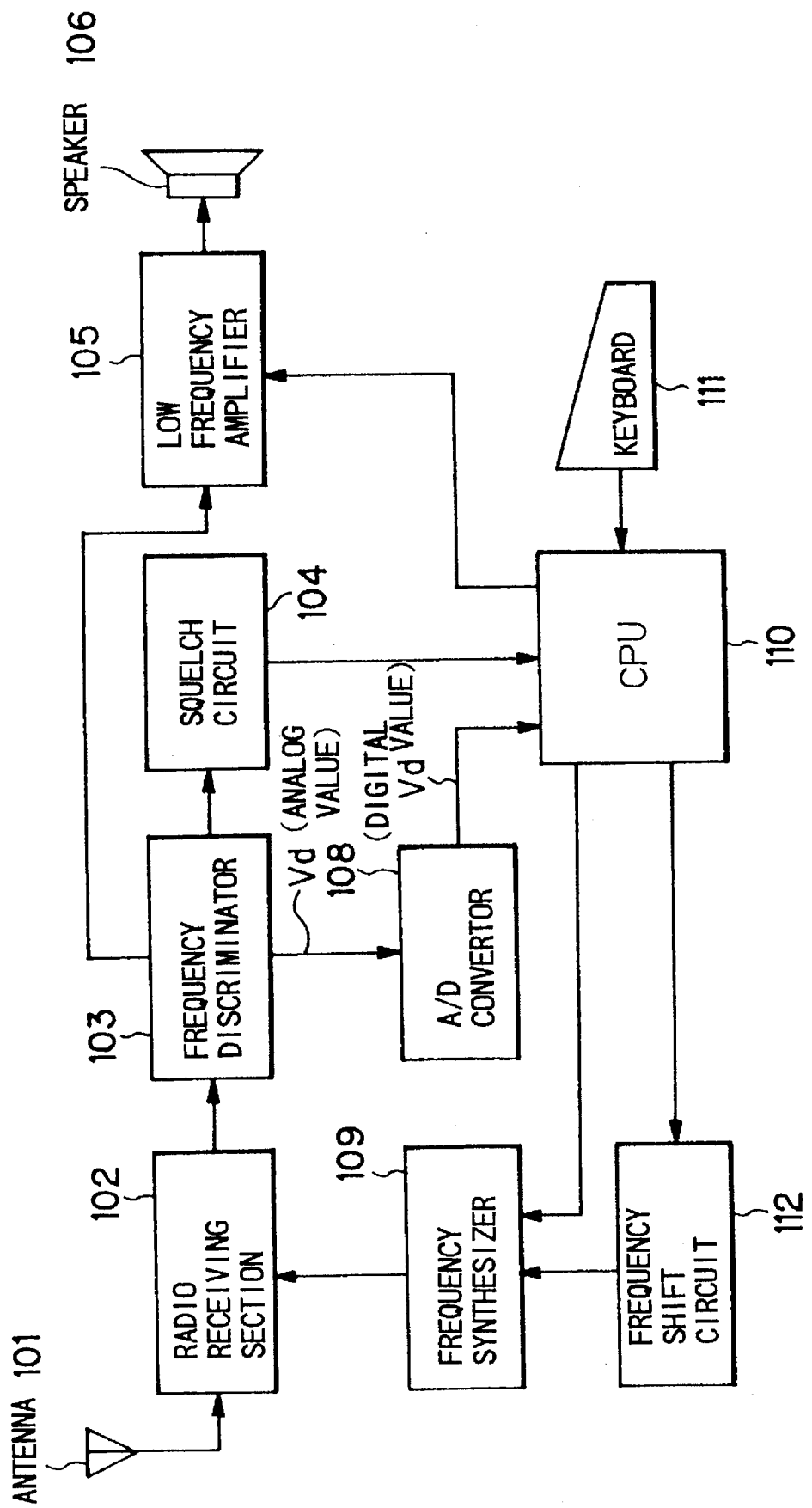
FIG. 1 is a block diagram of a radio receive according to one embodiment of the present invention.

FIG. 1 is a block diagram of a radio receiver according to one embodiment of the present invention.

In this figure, the radio receiver according to the embodiment comprises an antenna 101, a radio receiving section 102, a frequency discriminator 103, a squelch circuit 104, a low frequency amplifier 105, a speaker 106, an A/D convertor 108, a frequency synthesizer 109, a CPU 110, a keyboard 111, and a frequency shift circuit 112.

The radio receiving section 102 is provided with a mixer which mixes a received signal with a frequency shifted by the frequency synthesizer 109 to generate an intermediate frequency, an intermediate frequency filter which allows only a frequency in a prespecified bandwidth to pass therethrough, and other related components.

Figure 4:
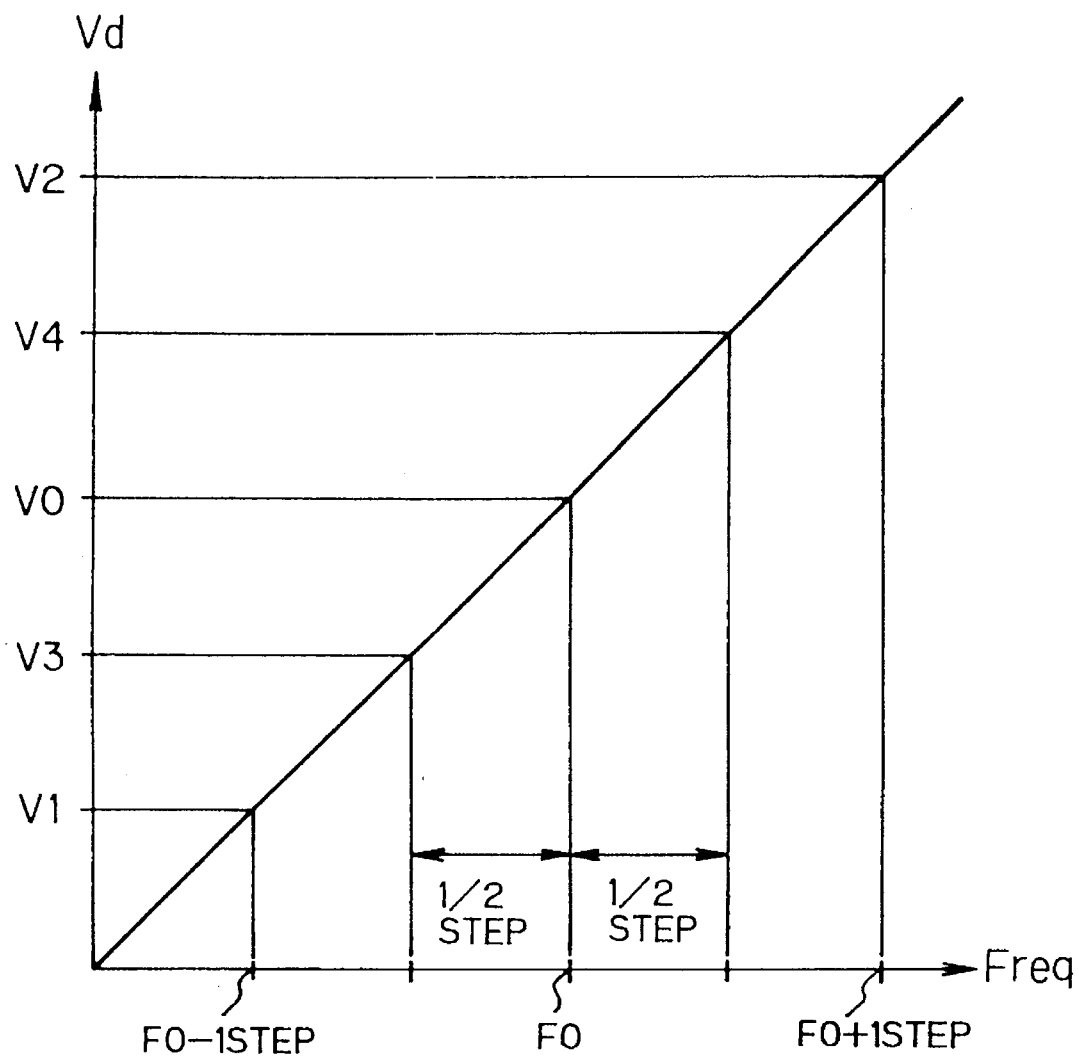
FIG. 4 is a drawing showing wave detection characteristics in a frequency discriminator.
Figure 5:
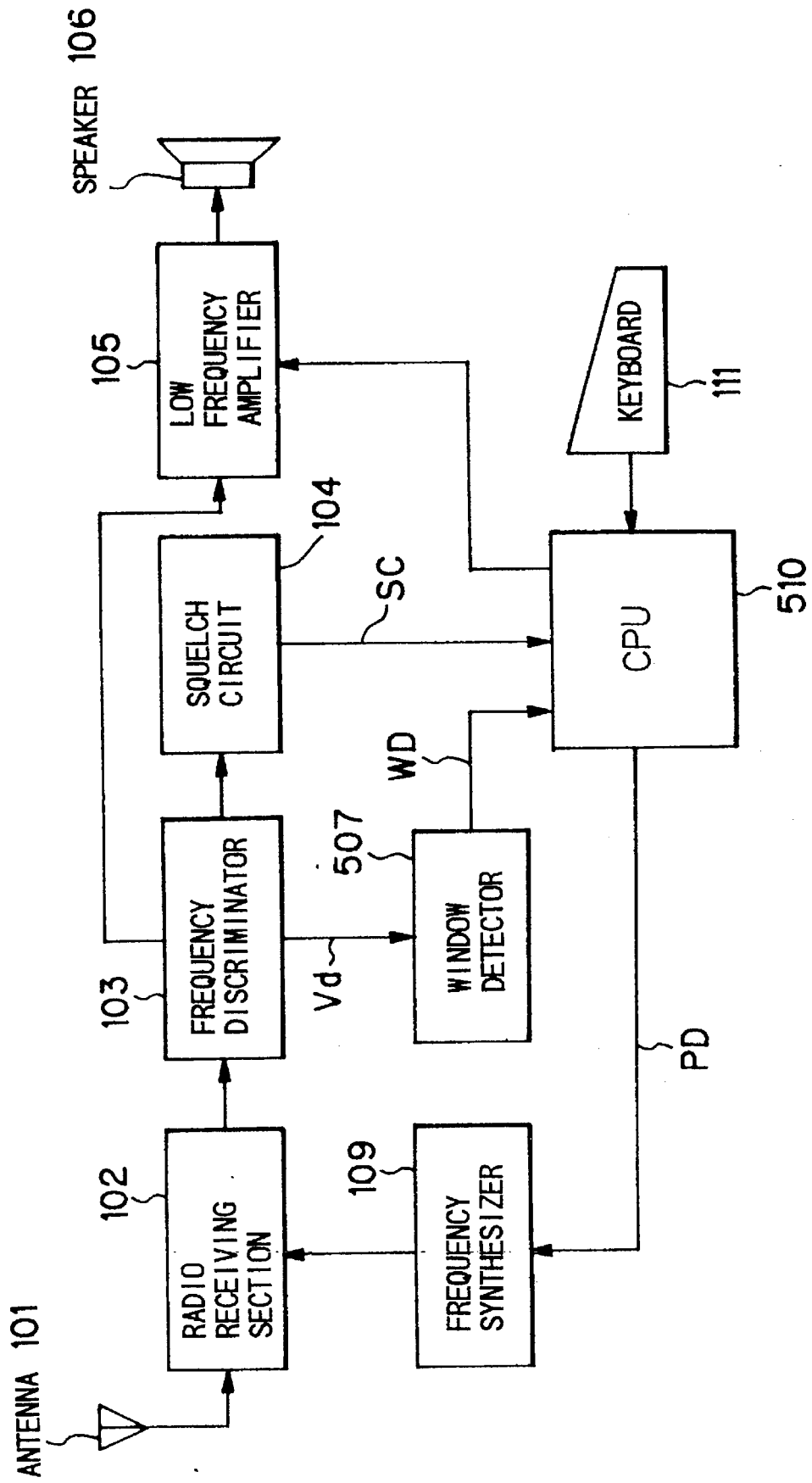
FIG. 5 is a block diagram of a first conventional type of FM radio receiver.
Figure 6:
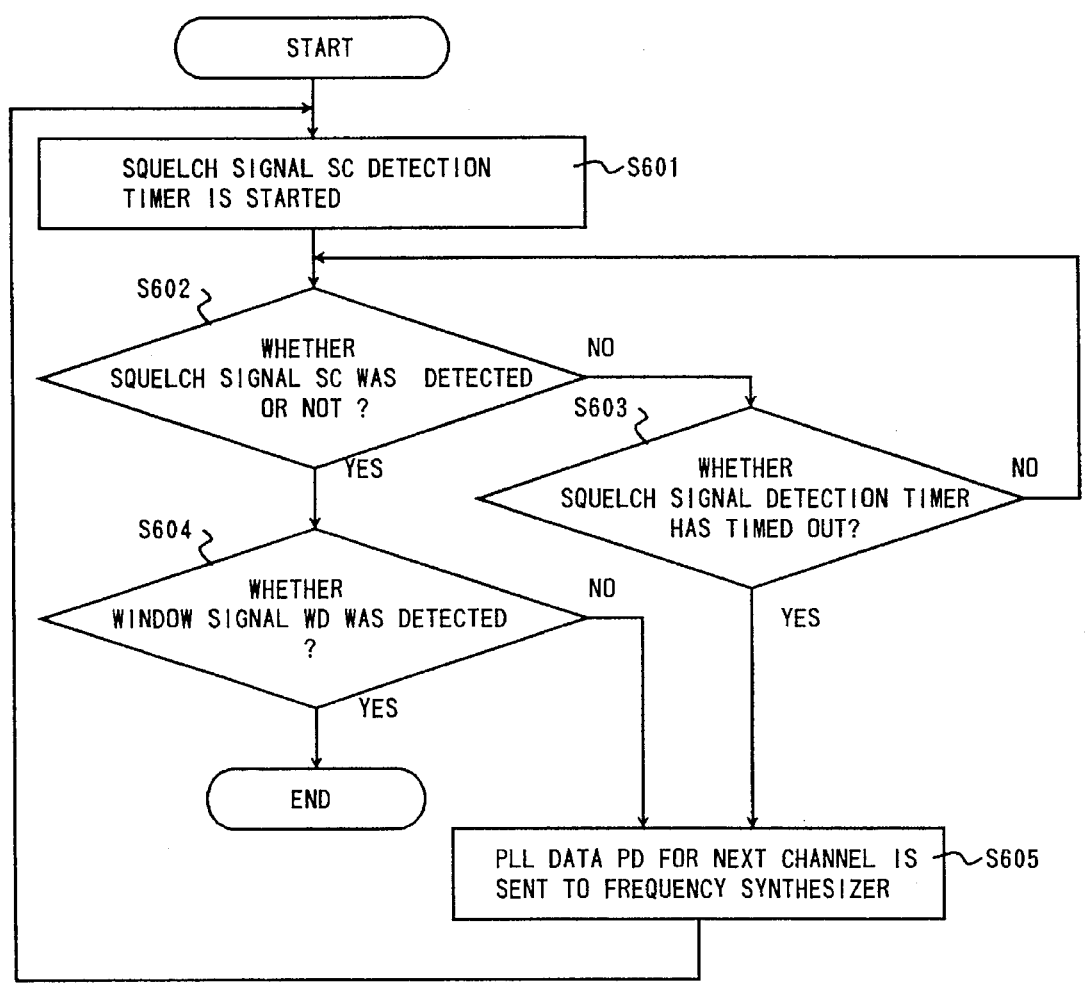
FIG. 6 is a flow chart of a general search operation in the first conventional type of FM radio receiver.
Figure 7:
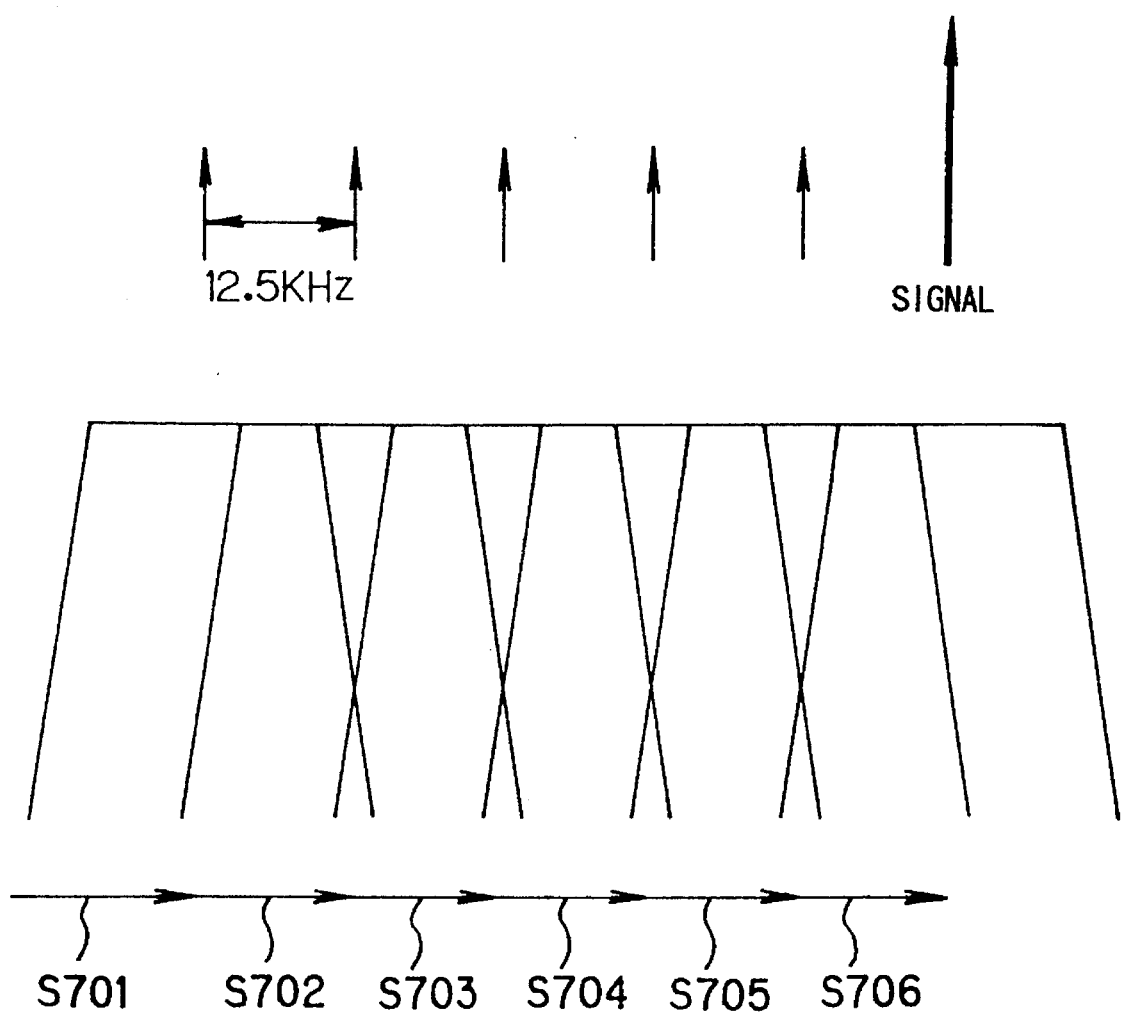
FIG. 7 is a drawing for explaining a general search operation in the first conventional type of FM radio receiver.
Figure 8:
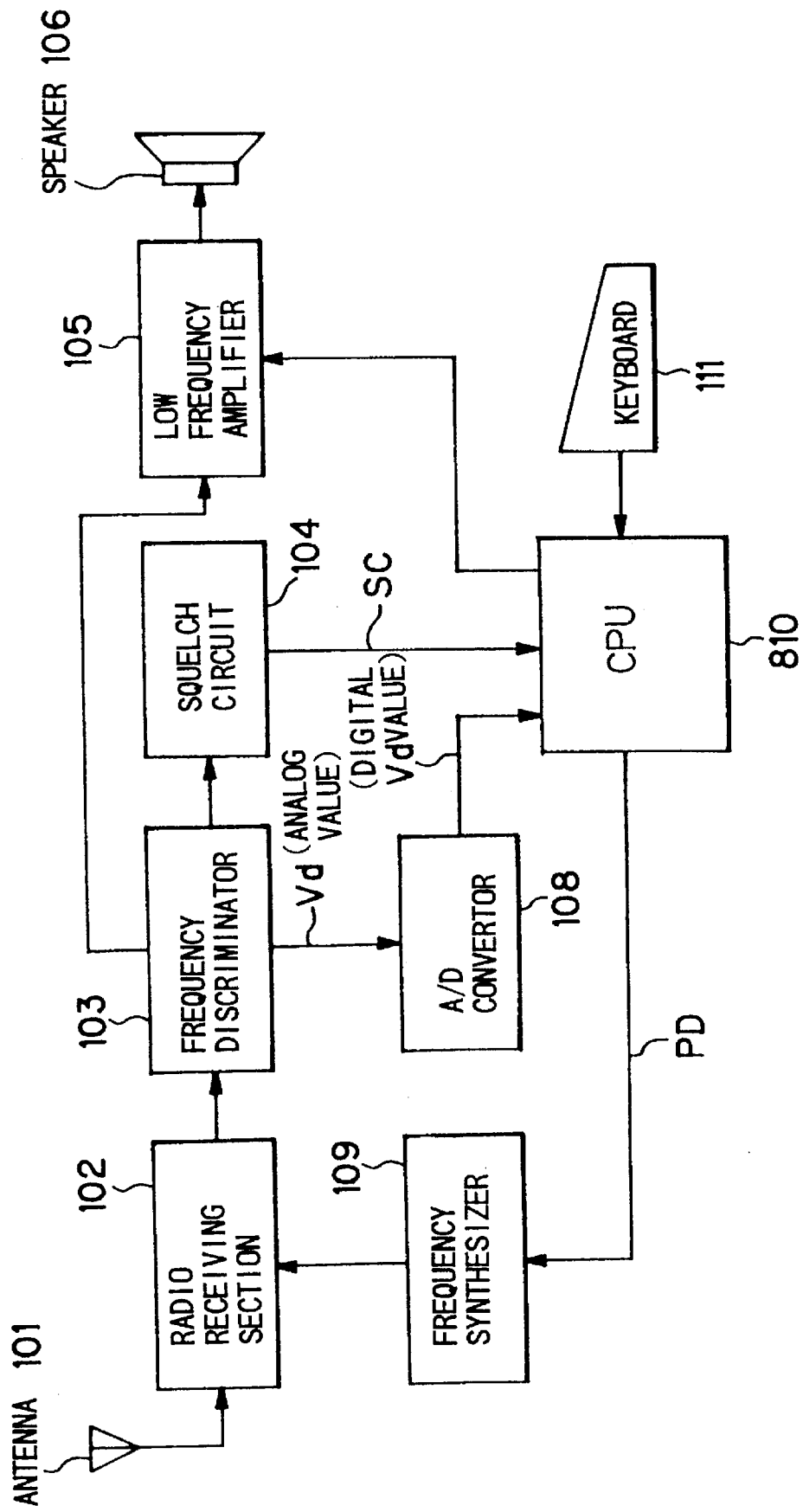
FIG. 8 is a block diagram of a second conventional type of FM radio receiver.
Figure 9:
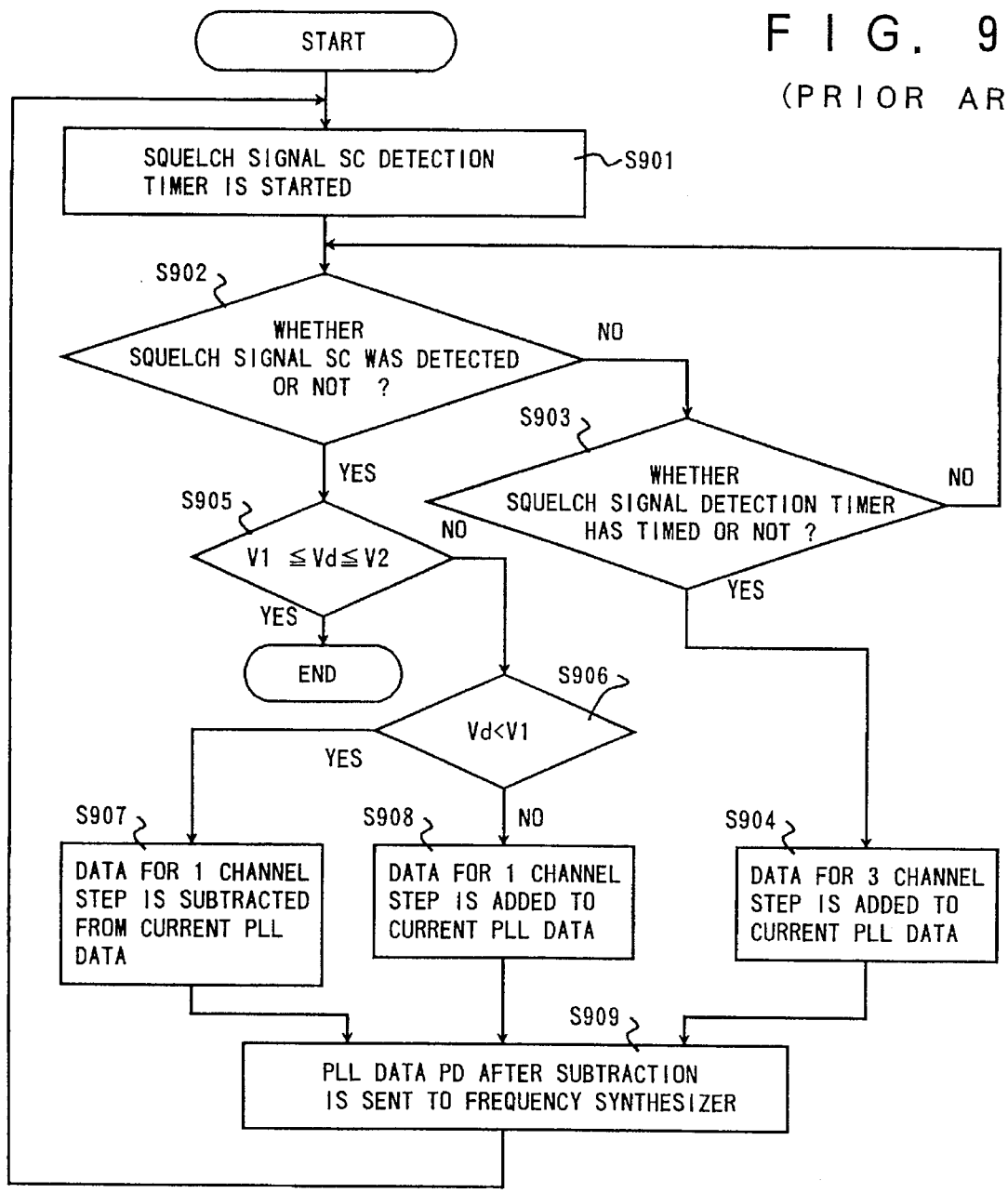
FIG. 9 is a flow chart of a turbo search operation in the second conventional type of FM radio receiver.
Figure 10:
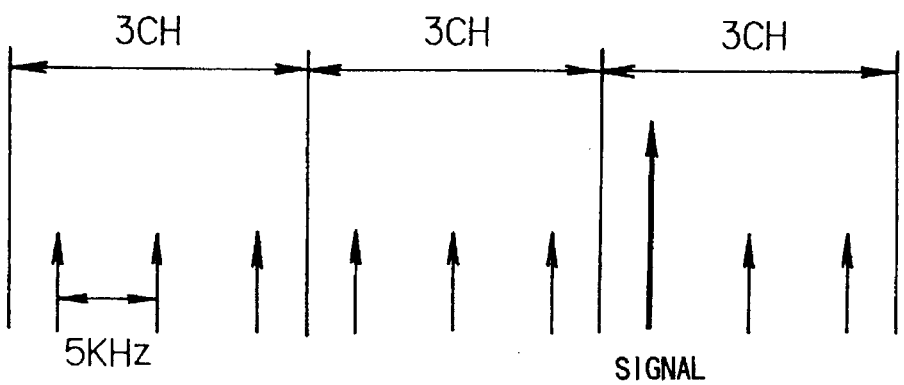
FIG. 10 is a drawing for explaining a turbo search operation for the second conventional type of FM radio receiver.
Figure 10:
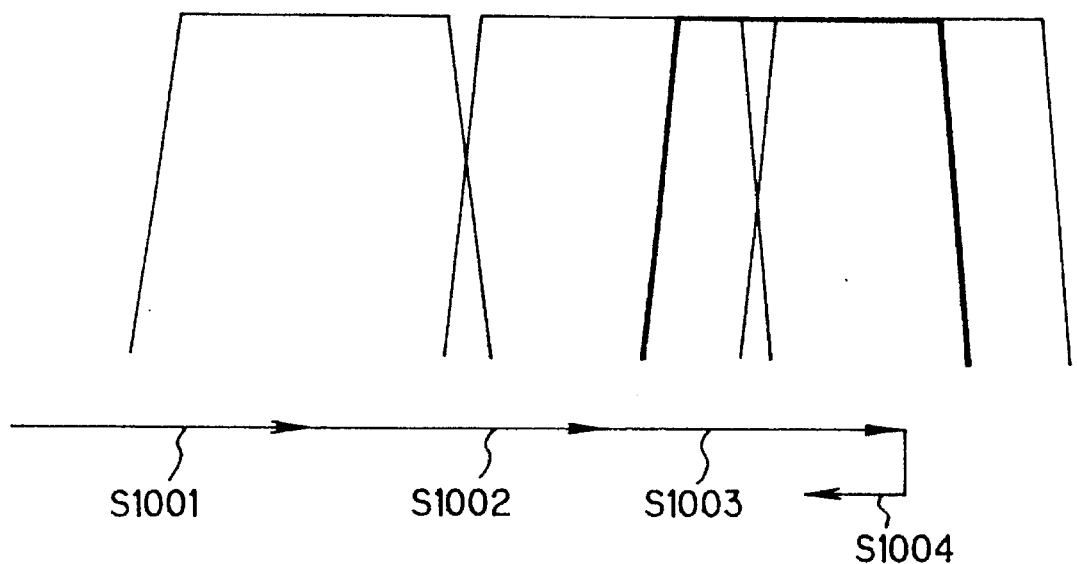
Figure 11:
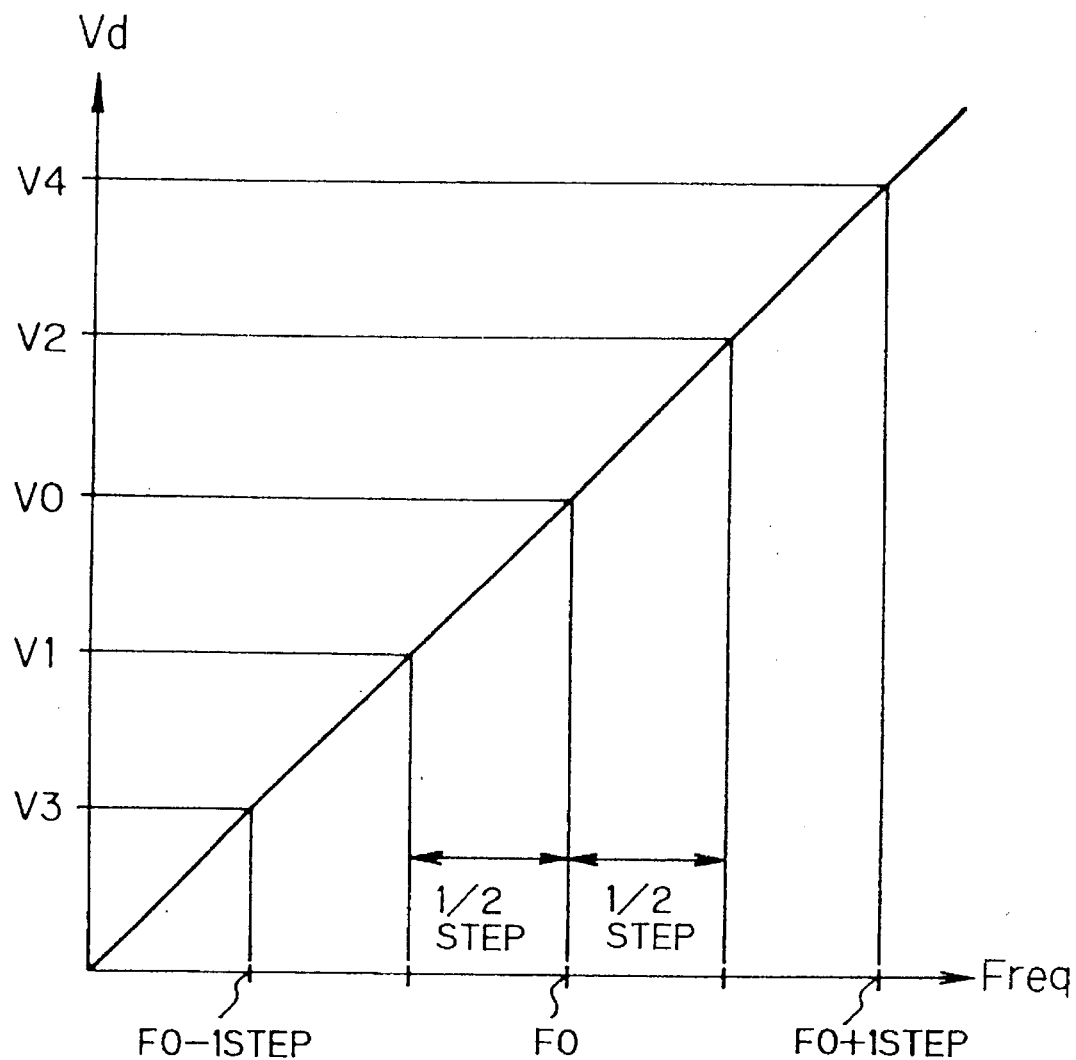
FIG. 11 is a drawing showing wave detection characteristics in a frequency discriminator according to the conventional type of FM radio receiver.

The frequency discriminator 103 detects a signal outputted via the intermediate frequency filter from the radio receiving section 102 and converts a frequency of the detected signal to a voltage, and a portion of the wave detection characteristics is shown in FIG. 4.

The squelch circuit 104 makes a determination as to whether there is a desired received signal depending on an output voltage Vd from the frequency discriminator 103.

The A/D convertor 108 converts an output voltage Vd (analog value) from the frequency discriminator 103 to supply it to the CPU 110.

The frequency synthesizer 109 is a frequency synthesizer using a phase-locked loop (PLL) therein, which comprises a phase comparator that compares, for instance, a reference signal to a phase of a comparison signal which is an output from a variable divider, a charge pump, a low-pass filter, a voltage control oscillator (VCO), and a variable divider, and obtains an oscillation frequency of the VCO of N times the frequency of a reference signal by changing a division ratio N in the variable divider.

The CPU (central processing unit; control means) 110 is realized with such a device as, for instance, a microcomputer, and information concerning channels each having a prespecified frequency and registered therein is stored in a data memory of the CPU 110. Also stored in a program memory of the CPU 110 is information concerning, for instance, a processing sequence of a turbo search operation for the VHF band described in relation to the second conventional type of radio receiver, or a processing sequence of a turbo search operation for the UHF band described later.

Furthermore, the frequency shift circuit 112 shifts an oscillation frequency of the frequency synthesizer 109 depending on control by the CPU 110.

It should be noted that a turbo search operation executed by the CPU 110 to the UHF band comprises a step of shifting the frequency of the frequency synthesizer 109 with the frequency shift circuit 112 so that as many channels to be scanned as possible will be included in a specified bandwidth of an intermediate frequency filter, a step of detecting a desired received signal by scanning each of the specified bandwidths with the shifted frequency, a step of scanning each channel within a bandwidth in which a desired received signal was detected, and a step of changing the frequency of the frequency synthesizer 109 or shifting the frequency of the frequency synthesizer 109 with the frequency shift circuit 112 so that the detected desired channel frequency will be at the center of the bandwidth.

Figure 2:
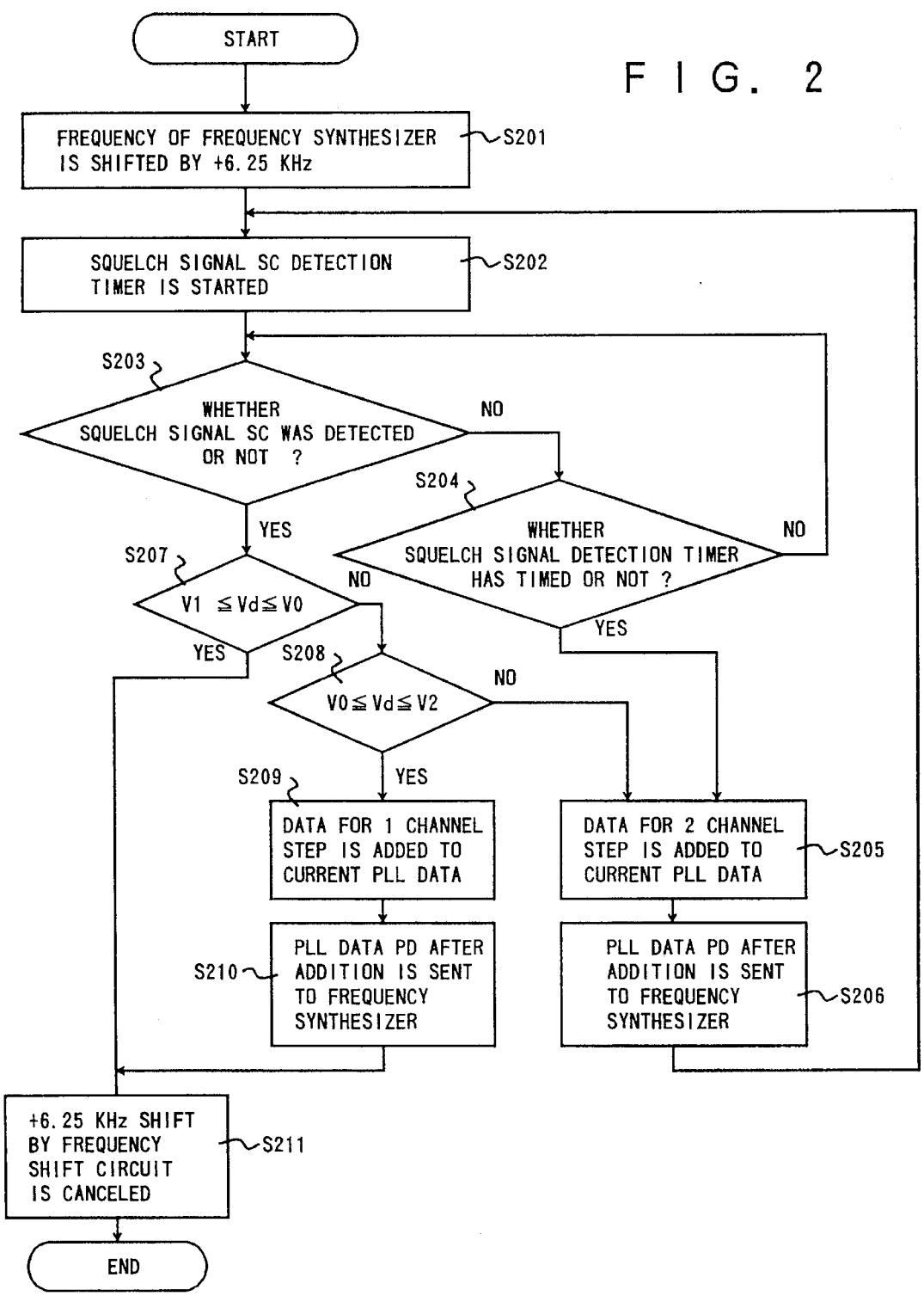
FIG. 2 is a flow chart of a turbo search operation for the UHF band in a radio receiver according to the embodiment.

Next, a detailed description is made for a turbo search operation to the UHF band in the radio receiver according to the present embodiment as described above with reference to the flow chart shown in FIG. 2. It should be noted that the figure shows a processing sequence by the CPU 110 which controls the turbo search operation.

At first, in Step S201, a frequency of the frequency synthesizer 109 is shifted by +6.25 KHz by the frequency shift circuit 112.

Next, in Step S202, a squelch signal detection timer is started to detect a squelch signal SC from the squelch circuit 104, and determination as to whether the squelch signal SC was detected or not is executed in Step S203.

If the squelch signal SC is not detected in Step S203 and the squelch signal detection timer has not timed out in Step S204, control returns again to Step S203 and the operation for detecting the squelch signal SC is continued.

If the squelch signal detection timer has timed out in Step S204, data for 2 channel steps is added to the current PLL data in Step S205, and the PLL data PD after addition is sent to the frequency synthesizer 109, and then control again returns to Step S203 to start operation of the squelch signal detection timer.

If the squelch signal SC is detected in Step S203, determination is made in Step S207 as to whether the output from the A/D convertor 108, namely output voltage Vd from the frequency discriminator 103, is in a range between the lower threshold voltage V1 and the voltage V0 corresponding to the central frequency F0 in a bandwidth of the current intermediate frequency filter.

Herein the upper threshold voltage V2 and lower threshold voltage V1 are set as indicated by the characteristics of the frequency discriminator 103 shown in FIG. 4. In this figure, assuming that an output voltage from the frequency discriminator 103 in correspondence to the central frequency F0 of a bandwidth of a current intermediate frequency filter is V0, the upper threshold voltage V2 corresponds to a frequency between F0 and F0+ (1 channel step) while the lower threshold voltage V1 corresponds to a frequency between F0− (1 channel step) and F0, and furthermore voltage V4 corresponds to a frequency between F0 and F0+ (½ channel step) while voltage V3 corresponds to a frequency between F0− (½ channel step) and F0.

In Step S207, if it is determined that the output voltage Vd from the frequency discriminator 103 is in a range between the voltage V1 and voltage V0, control goes to Step S211 and cancels the +6.25 KHz shift by the frequency shift circuit 112, and thus the processing is terminated on the recognition that the desired frequency was searched.

In Step S207, if it is determined that the output voltage Vd from the frequency discriminator 103 is not in a range between the lower side threshold voltage V1 and voltage V0, control goes to Step S208, and determination is made as to whether the output voltage Vd from the frequency discriminator 103 is in a range between the voltage V0 corresponding to the central frequency F0 of a bandwidth of the current intermediate filter and the upper side threshold voltage V2.

In Step S208, if it is determined that the output voltage Vd from the frequency discriminator 103 is in a range between the voltage V0 and voltage V2, control goes to step S209, where data for 1 channel step is added to the current PLL data, and in Step S210, the PLL data PD after addition is sent to the frequency synthesizer 109, and then control goes to Step S211, where the +6.25 KHz shift by the frequency shift circuit 112 is canceled. Thus the processing is terminated on the recognition that the desired frequency was searched.

In Step S208, if it is determined that the output voltage Vd from the frequency discriminator 103 is not in a range between the voltage V0 and voltage V2, control goes to Step S205, where data for 2 channel steps is added to the current PLL data, the PLL data after addition is sent to the frequency synthesizer 109, and then control again returns to Step S203.

Figure 3:
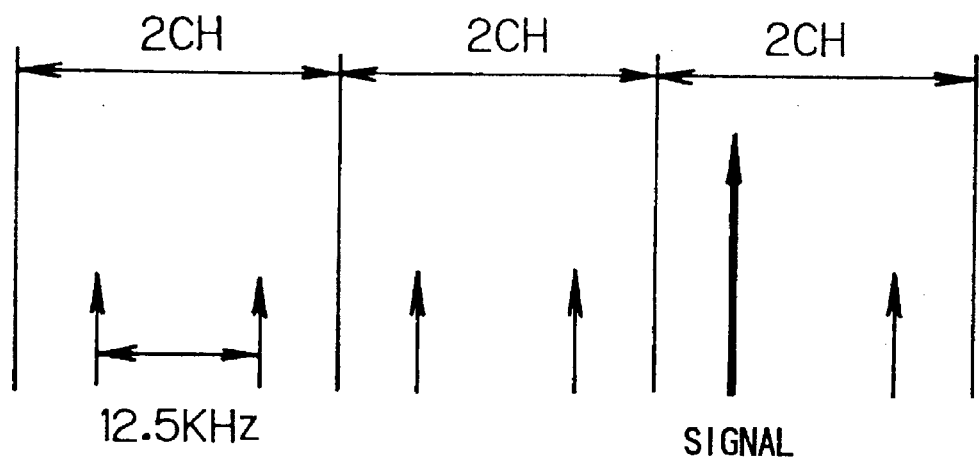
FIG. 3 is a drawing for explaining a turbo search operation for the UHF band in the radio receiver according to the embodiment.
Figure 3:
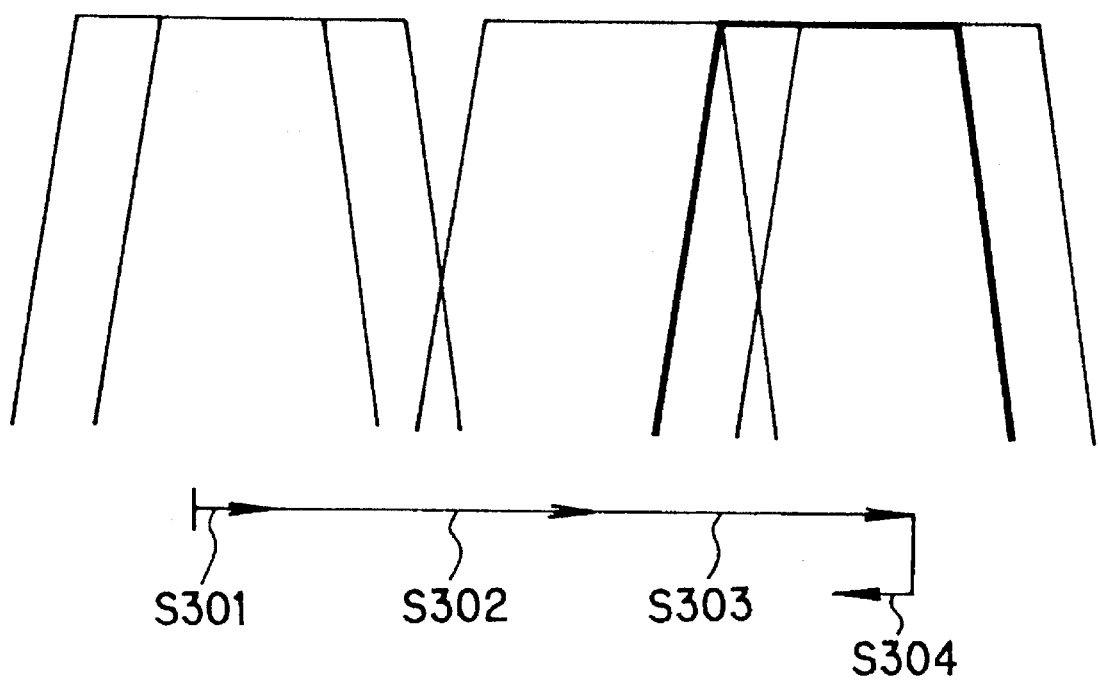

For instance, if it is assumed that the channel step is 12.5 KHz and the desired signal frequency is present at the position pointed by the bold line arrow in the figure, the processing from Steps S202 to S208 is repeatedly executed after the processing in Step S201 above for the search steps S301 to S302, the processing from Step S202 to Step S203 to Step S207 are executed in the search step S303, and furthermore the step S211 described above is executed in the search step S304 for searching a desired signal frequency. It should be noted that the trapezoidal section shown at a center of FIG. 3 indicates a bandwidth to be searched (a window including 2 channels), and a bandwidth when a desired signal frequency is identified is a range of the trapezoidal section shown by a bold solid line in the figure.

Also in this embodiment, when a turbo search operation is executed to the VHF band, as in the second conventional type of radio receiver, a search is executed for each of the specified bandwidths (window including 3 channels), and when a signal is detected, a search is executed for each channel (1 channel step=5 KHz).

As described above, in the present embodiment, when a turbo search operation is executed to the UHF band, 2 channels are included in a specified bandwidth by shifting the frequency of the frequency synthesizer by 6.25 KHz, and a search is executed to each of specified bandwidths (window including 2 channels) according to a sequence similar to that for a turbo search operation in the second conventional type of radio receiver. After a signal is detected, a search is executed to each channel (1 channel step=12.5 KHz), so that a search operation can be executed at a 2 times higher speed than that in the first conventional type of radio receiver.

For the reasons as described above, it is not necessary to provide a plurality of intermediate frequency filter circuits or detection circuits separately in a radio receiver, and a radio receiver which allows a more accurate search operation at a higher speed to a plurality of bands (such as, for instance, VHF or UHF) can be realized with less hardware.

As described above, with a radio receiver according to the present invention, the method of selecting a station for a radio receiver for selecting a channel from channels each having a prespecified frequency allocated thereto respectively comprises a first frequency shift step for shifting a frequency of a local oscillator so that as many channels to be scanned as possible will be included within a specified bandwidth, a first scanning step for scanning each of the specified bandwidths with the shifted frequency, a second scanning step for scanning each channel within the bandwidth after a signal is detected in the first scanning step, a second frequency shift step for shifting the frequency of the local oscillator so that the desired channel frequency identified in the second scanning step will be at the center of the bandwidth. Hence, it is not necessary to provide a plurality of intermediate frequency filter circuits or detection circuits in a radio receiver and a method of selecting a radio receiver enabling a more accurate search operation to a plurality of bands each having a different channel step can be provided with less hardware.

With a method of selecting a station for a radio receiver according to the present invention, the method of selecting a station for a radio receive for selecting a channel from a plurality of channels each having a prespecified frequency respectively comprises a first frequency shift step for shifting a frequency of a local oscillator so that 2 channels to be scanned will be included within a specified bandwidth, a first scanning step for scanning each of the specified bandwidths with the shifted frequency, a second scanning step for scanning each channel within the specified bandwidth after a signal is detected in the first scanning step and also for making a frequency obtained by adding the scan width in the first channel scan to the oscillation frequency of the current local oscillator oscillated from the local oscillator when the frequency of the detected signal is not less than the central frequency of the bandwidth, and a second frequency shift step for shifting a frequency of the local oscillator so that the desired channel frequency identified in the second scanning step will be at the center of the bandwidth, so that a method of selecting a station for a radio receiver enabling a more accurate search to a plurality of bands each having a different channel step can be realized with less hardware.

With a method of selecting a station for a radio receiver according to the present invention, in the second frequency shift step, the frequency of the local oscillator is shifted in the direction reverse to and by the same rate as shift in the first frequency step, so that the same effects as those by the radio receivers according to the above inventions can be realized.

With a method of selecting a station for a radio receiver according to the present invention, the local oscillator is a frequency synthesizer using a phase-locked loop (PLL) therein, so that the effects as described above can be realized and also a method of selecting a station for a radio receiver enabling easy control over a local oscillation frequency inside the radio receiver can be provided.

Also in a radio receiver which selects a channel from channels each having a prespecified frequency allocated thereto according to present invention, the frequency of a local oscillator is shifted by a frequency shift circuit so that as many channels to be scanned as possible will be included, for instance, within a specified bandwidth of an intermediate frequency filter. For instance, a received signal is mixed in a radio receiving section with a shifted frequency of a the local oscillator to generate an intermediate frequency, a frequency of a signal having passed through an intermediate frequency filter is converted to a voltage, determination as to whether the signal is a desired received signal or not is made depending on an output voltage from a frequency discriminator in a squelch circuit. Furthermore, scanning is executed to each channel in a bandwidth in which the desired received signal by a controller after a desired received signal is detected by a squelch circuit by scanning each specified bandwidth, and a frequency of a local oscillator is changed or a frequency of a local oscillator is shifted by a frequency shift circuit, so that the desired channel frequency identified as described above will be at the center of the bandwidth. Hence, it is not necessary to provide a plurality of intermediate frequency filters or detection circuits within a radio receiver and it is possible to provide a radio receiver enabling a more accurate search operation at a higher speed to a plurality of bands each having a different channel step with less hardware.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of selecting a station for a radio receiver for selecting a channel from those each having a prespecified frequency allocated thereto respectively, comprising:

a first frequency shift step for shifting a frequency of a local oscillator so that as many channels to be scanned as possible will be included within specified bandwidths, a first scanning step for scanning each of the specified bandwidths with the shifted frequency, a second scanning step for scanning each channel within a respective bandwidth after a signal is detected in the first scanning step, and a second frequency shift step for shifting a frequency of said local oscillator so that a desired channel frequency identified in the second scanning step will be at the center of said respective bandwidth.

2. A method of selecting a station for a radio receiver according to claim 1, wherein in said second frequency shift step, a frequency of said local oscillator is shifted in the direction reverse to and by the same rate as shift in the first frequency shift step.

3. A method of selecting a station for a radio receiver according to claim 1, wherein said local oscillator is a frequency synthesizer using a phase-locked loop (PLL) therein.

4. A method of selecting a station for a radio receiver according to claim 2, wherein said local oscillator is a frequency synthesizer using a phase-locked loop (PLL) therein.

5. A method of selecting a station for a radio receiver for selecting a channel from those each having a prespecified frequency allocated thereto respectively comprising:
- a first frequency shift step for shifting a frequency of a local oscillator so that two channels to be scanned, will be included within specified bandwidths,
- a first scanning step for scanning each of the specified bandwidths with the shifted frequency,
- a second scanning step for scanning each channel after a signal is detected in the first scanning step, and making a frequency obtained by adding a scan width in the 1-channel scanning to an oscillation frequency of said current local oscillator derived from said local oscillator when a frequency of the detected signal is not less than the central frequency of a specified bandwidth corresponding to a detected signal, and
- a second frequency shift step for shifting a frequency of said local oscillator so that a desired channel frequency identified in the second scanning step will be at the center of said specified bandwidth corresponding to said detected signal.

6. A method of selecting a station for a radio receiver according to claim 5, wherein in said second frequency shift step a frequency of said local oscillator is shifted in the direction reverse to and by the same rate as shift in the first frequency shift step.

7. A method of selecting a station for a radio receiver according to claim 5, wherein said local oscillator is a frequency synthesizer using a phase-locked loop (PLL) therein.

8. A method of selecting a station for a radio receiver according to claim 6, wherein said local oscillator is a frequency synthesizer using a phase-locked loop (PLL) therein.

9. A radio receiver which selects a channel for those each having a prespecified frequency allocated thereto respectively, comprising:
- a local oscillator,
- a frequency shift circuit which shifts a frequency of said local oscillator,
- a radio receiving section provided with a filter which passes therethrough only frequencies at least within specified bandwidths,
- a frequency discriminator which converts a frequency outputted from said radio receiving section to a voltage,
- a squelch circuit which makes a determination as to whether a received signal is a desired one depending on an output voltage from said frequency discriminator, and
- a controller which shifts a frequency of said local oscillator with said frequency shift circuit so that as many channels to be scanned as possible will be included within the specified bandwidths, detects a desired received signal by scanning each of the specified bandwidths with the shifted frequency, scans each channel within the bandwidth where the desired received signal was detected, and changes a frequency of said local oscillator or shifts a frequency of said local oscillator with said frequency shift circuit so that the desired channel frequency identified above will be at the center of said bandwidth.

10. A frequency-modulation receiver comprising:
- a radio receiving section responsive to a received signal for generating an intermediate frequency signal,
- a frequency synthesizer responsive to a central processor for supplying said radio receiving section with a signal for selecting a predetermined channel from a plurality of communication channels, and
- a frequency shift circuit responsive to said central processor for supplying said frequency synthesizer with a frequency shift signal indicative of a specified bandwidth covering said plurality of communication channels.

11. The receiver of claim 10, wherein said frequency shift circuit controls said frequency synthesizer so as to generate a further frequency shift signal for shifting the frequency of said predetermined channel to the center of said specified bandwidth.

12. The receiver of claim 10 further comprising a squelch circuit responsive to said intermediate frequency signal for supplying said central processor with information as to existence of the received signal in a scanned bandwidth.

13. The receiver of claim 10, wherein said frequency synthesizer comprises a phase-locked loop.

14. The receiver of claim 10, wherein said central processor comprises information on preselected channels to be scanned and defines an sequence of a search for the predetermined channel.

* * * * *